(12) United States Patent
Teramoto et al.

(10) Patent No.: US 8,680,878 B2
(45) Date of Patent: Mar. 25, 2014

(54) ELECTRIC CURRENT MEASURING DEVICE WITH IMPROVED INSTALLABILITY

(75) Inventors: Toshiyo Teramoto, Okazaki (JP); Shigenobu Nakamura, Anjo (JP)

(73) Assignee: Denso Corporation, Kariya (JP)

( * ) Notice: Subject to any disclaimer, the term of this patent is extended or adjusted under 35 U.S.C. 154(b) by 655 days.

(21) Appl. No.: 12/869,174

(22) Filed: Aug. 26, 2010

(65) Prior Publication Data

US 2011/0050260 A1 Mar. 3, 2011

(30) Foreign Application Priority Data

Aug. 31, 2009 (JP) ................................ 2009-200022
May 13, 2010 (JP) ................................ 2010-110708

(51) Int. Cl.
*G01R 27/08* (2006.01)
(52) U.S. Cl.
USPC .......................................... 324/705; 324/713
(58) Field of Classification Search
USPC ........................... 324/705, 713; 439/754–768
See application file for complete search history.

(56) References Cited

U.S. PATENT DOCUMENTS

| | | | |
|---|---|---|---|
| 7,381,101 B2 * | 6/2008 | Roset et al. ..................... | 439/754 |
| 7,573,274 B2 * | 8/2009 | Aratani ......................... | 324/713 |
| 7,663,376 B2 * | 2/2010 | Fernandez ..................... | 324/555 |
| 8,142,237 B2 * | 3/2012 | Condamin et al. ............. | 439/762 |
| 2008/0030208 A1 | 2/2008 | Aratani | |

FOREIGN PATENT DOCUMENTS

| | | |
|---|---|---|
| JP | A-04-083175 | 3/1992 |
| JP | A-2000-068101 | 3/2000 |
| JP | A-2008-39571 | 2/2008 |

OTHER PUBLICATIONS

Aug. 2, 2011 Office Action issued in Japanese Patent Application No. 2010-110708 (with translation).

* cited by examiner

*Primary Examiner* — Arleen M Vazquez
*Assistant Examiner* — Alesa Allgood
(74) *Attorney, Agent, or Firm* — Oliff PLC (57) ABSTRACT

In a current measuring device for measuring an electric current flowing through between a terminal of a battery and a wire, a resistance member has a length and first and second ends in a direction of the length. The first end is to be secured electrically to the terminal of the battery. The second end is to be secured electrically to the wire. The resistance member constitutes a current flow path between the terminal of the battery and the wire. The resistance member has a turned portion through which the current flow path extends. The current measuring device includes a circuit board in which a current measuring circuit is installed. The current measuring circuit measures an electric current flowing through the resistance member based on a potential difference between two different points defined on the resistance member.

10 Claims, 6 Drawing Sheets

ELECTRIC CURRENT MEASURING DEVICE WITH IMPROVED INSTALLABILITY

CROSS REFERENCE TO RELATED APPLICATIONS

This application is based on Japanese Patent Applications 2009-200022 and 2010-110708 filed on Aug. 31, 2009 and May 13, 2010, respectively. This application claims the benefit of priority from the Japanese Patent Application, so that the descriptions of which are all incorporated herein by reference.

FIELD OF THE INVENTION

The present invention relates to electric current measuring devices to be installed in, for example, motor vehicles such as passenger vehicles and motor trucks; these electric current measuring devices are operative to sense or measure an electric current being charged into or discharged from a storage battery mounted in their corresponding motor vehicles.

BACKGROUND OF THE INVENTION

One type of current sensors as current measuring devices is equipped with a case, a current measuring circuit retained in the case, and a flat long busbar as a shunt resistor; this flat long busbar serves as a ground line extending from a negative terminal (minus terminal) of a storage battery; the case is disposed on the middle portion of the flat busbar. The current measuring circuit measures an electric current being charged into or discharged from the storage battery through the negative terminal of the storage battery and the ground line based on voltage drop across the busbar by the electric current. One example of this type of current sensors is disclosed in Japanese Patent Application Publication No. 2008-39571.

SUMMARY OF THE INVENTION

The inventors have discovered that there is a point that should be improved in these current sensors of the one type.

Specifically, the busbar of a current sensor of the one type, which has a flat and long shape, is electrically joined to the negative terminal of the storage battery directly or indirectly through a bracket so that the busbar extends from the negative terminal thereof. This installation structure of the current sensor on the negative terminal of the battery causes part of the busbar projecting from the negative terminal of the storage battery to increase in length. Thus, when such a current sensor whose busbar has a long projecting length from the negative terminal of the storage battery is installed in an apparatus equipped with the storage battery, a large space for installation of the current sensor is required, which may reduce the installability of the current sensor.

In order to increase the accuracy of measuring the electric current, it is preferable to increase the voltage drop across the busbar. A first measure for increasing the voltage drop across the busbar is to make the busbar longer in width and shorter in thickness. If the first measure was applied to a current sensor of the one type, the amount of heat generation from the busbar might increase so that the resistance of the busbar might fluctuate, resulting in deteriorating the current measurement accuracy.

Thus, for increasing the voltage drop across the busbar, a second measure will be used; this second measure is to make the busbar longer in length. However, when the second measure was applied to a current sensor of the one type, the installability and the vibration-resistance of the current sensor might be more deteriorated as the busbar is longer in length.

In view of the circumstances set forth above, the present invention seeks to provide current measuring devices designed to address the point that should be improved in the current sensors of the one type set forth above.

Specifically, the present invention aims at providing current measuring devices designed to have an improved installability and vibration resistance.

The present invention also aims at providing current measuring devices designed to have an improved accuracy of measuring an electric current.

According to one aspect of the present invention, there is provided a current measuring device for measuring an electric current flowing through between a terminal of a battery and a wire. The current measuring device includes a resistance member having a length and first and second ends in a direction of the length. The first end is to be secured electrically to the terminal of the battery. The second end is to be secured electrically to the wire. The resistance member constitutes a current flow path between the terminal of the battery and the wire. The resistance member has a turned portion through which the current flow path extends. The current measuring device includes a circuit board in which a current measuring circuit is installed. The current measuring circuit is configured to measure an electric current flowing through the resistance member based on a potential difference between two different points defined on the resistance member.

The resistance member constituting the current flow path between the terminal of the battery and the wire is configured to have the turned portion through which the current flow path extends. In other words, the configuration of the resistance member is configured to determine the potential difference between the two different points defined on the resistance member independently of the length of the interval between the first and second ends.

This configuration of the resistance member allows the interval between the first and second ends to be reduced as much as possible while keeping the current flowing path through the resistance member long in length. This makes it possible to improve the installability and vibration-resistance of the current measuring device while maintaining at a high level the current-measuring accuracy thereof.

BRIEF DESCRIPTION OF THE DRAWINGS

Other objects and aspects of the invention will become apparent from the following description of embodiments with reference to the accompanying drawings in which.

DETAILED DESCRIPTION OF EMBODIMENTS OF THE INVENTION

An embodiment of the present invention will be described hereinafter with reference to the accompanying drawings. In the drawings, identical reference characters are utilized to identify identical corresponding components.

Referring to FIGS. 1 to 4, there is illustrated an electric current measuring device 100 according to this embodiment of the present invention; this device 100 is attached to a storage battery 200 and operative to measure an electric current being charged into or discharged from a storage battery 200. The storage battery 200 is mounted at its bottom surface on, for example, the floor of the engine room of the motor vehicle. The battery 200 has an upper surface 200A on which a positive (plus) terminal 201 (see FIG. 5) and a negative (minus) terminal 202 are provided.

Figure 1:
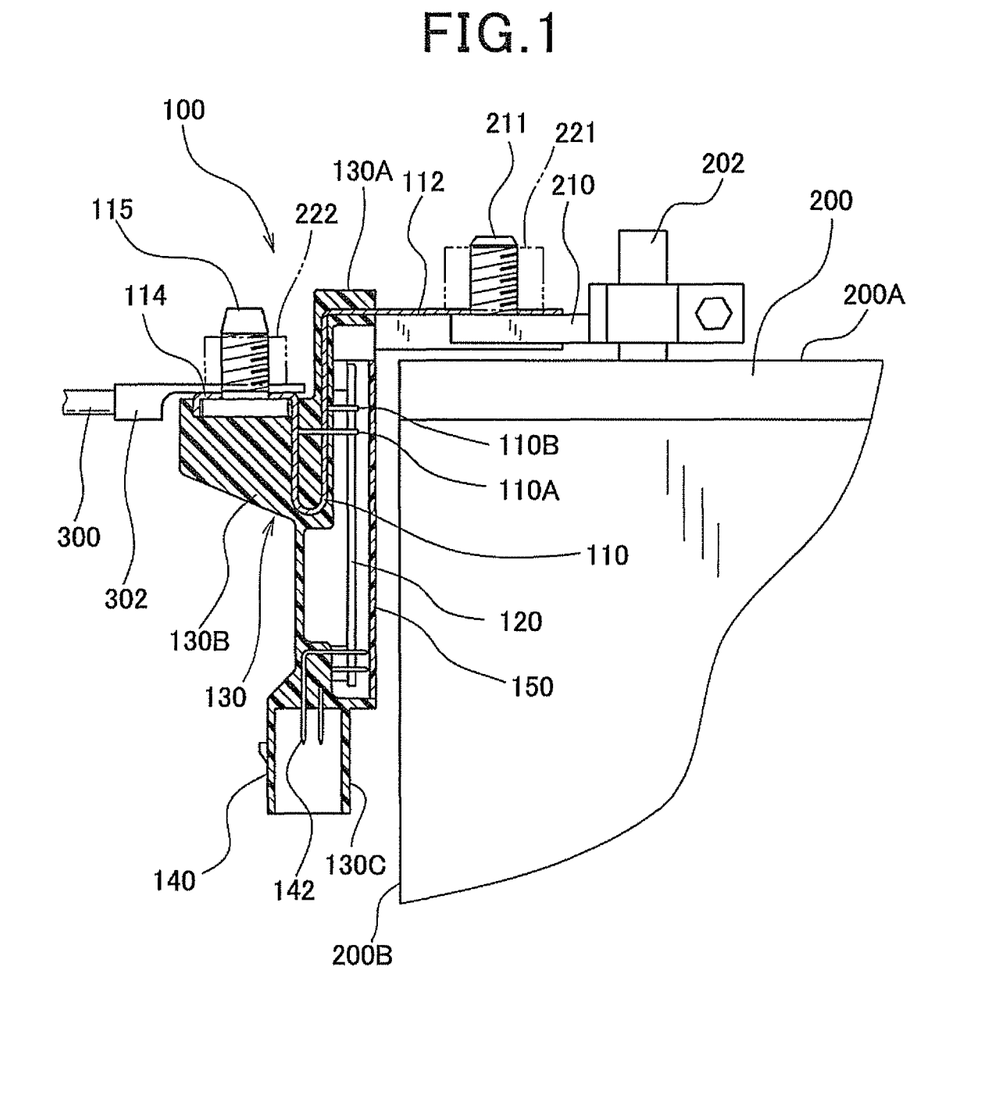
FIG. 1 is a partially sectional view of an electric current measuring device according to an embodiment of the present invention.
Figure 2:
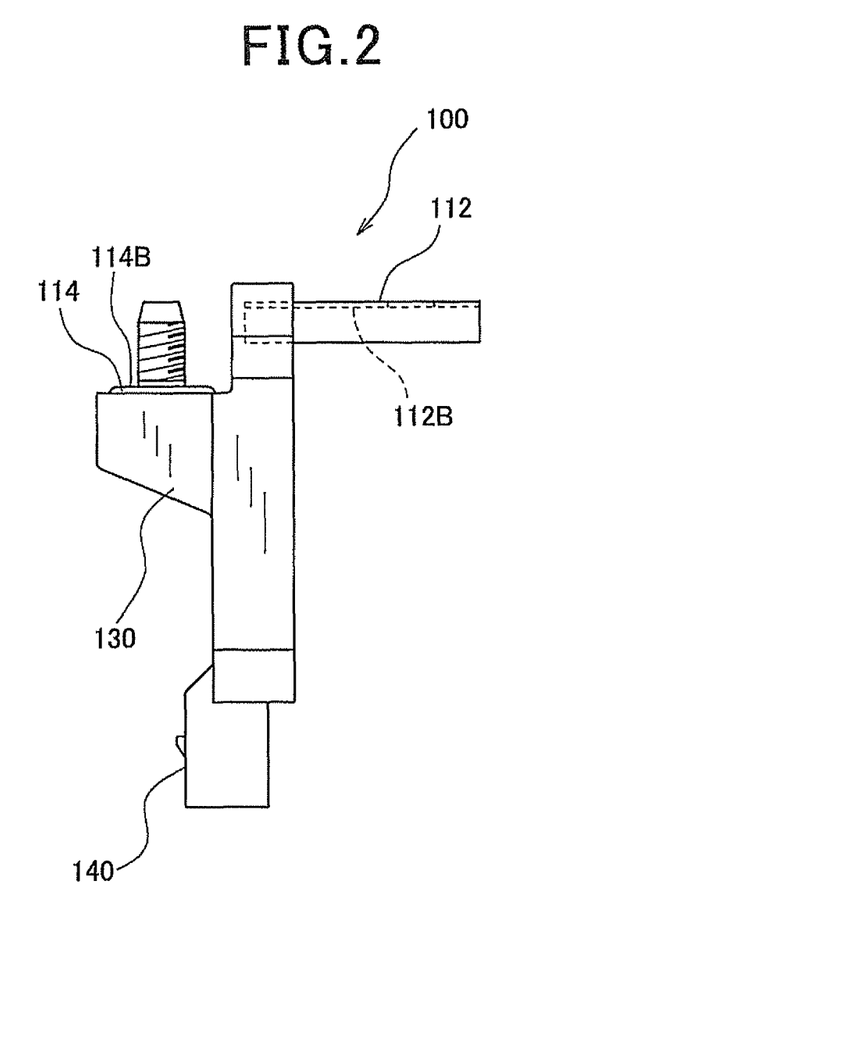
FIG. 2 is a side view of the current measuring device illustrated in FIG. 1.
Figure 3:
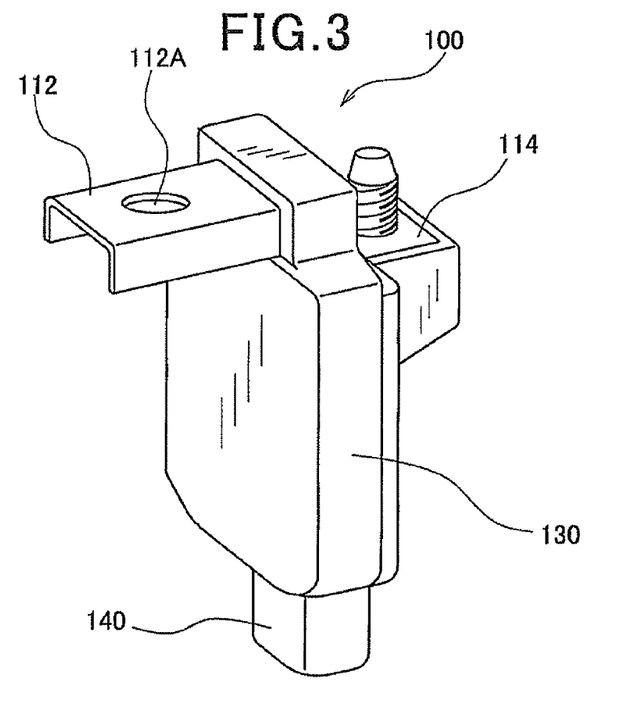
FIG. 3 is a perspective view of the current measuring device illustrated in FIG. 1.

The current measuring device 100 includes a busbar 110, a circuit board 120, a case 130, a connector 140, and a cover 150.

The busbar 110 is made of a conductive material. The circuit board 120 has mounted thereon a current measuring circuit operative to monitor a potential difference between two points on the busbar 110; these two points are located along a direction in which an electric current to be measured flows through the busbar 110. The current measuring circuit is also operative to measure (obtain) the electric current flowing through the busbar 110.

The case 130 has a substantially rectangular-parallelepiped inner-hollow housing with one opening wall. In the case 130, a major part of the busbar 110 and the circuit board 120 are stored. The connector 140 is comprised of a plurality of connector terminals 142 electrically connected with the circuit board 120. The cover 150 is fit in the one opening wall of the cover 130 to close the inner hollow portion (chamber) of the case 130.

The busbar 110 is shaped as a folded flat busbar. The busbar 110 has end portions exposed from the case 130, one of which serves as a first securement portion 112 secured to the battery 200 to establish electrical connection with the battery 200, the other of which serves as a second securement portion 114 secured to a harness 300, such as a bundle of wires for electrical connection of a plurality of components installed in the motor vehicle.

As illustrated in FIG. 1, the case 130 is arranged such that its longitudinal direction is substantially parallel to the height direction of the battery 200 between the upper surface 200A and the bottom surface, and the opening wall is closely opposite to the one side surface 200B of the battery 200; this one side surface 200B is the closest to the negative terminal 202 in all of the side surfaces thereof. A top side wall 130A of the housing of the case 130 faces the negative terminal 202 of the battery 200. Part of the other wall 130B of the housing of the case 130, which is opposite to the opening wall thereof, projects in a direction away from the one side surface 200B.

Figure 4A:
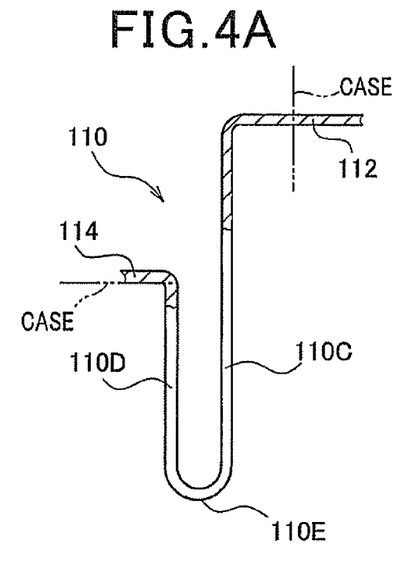
FIG. 4A is a front view of a busbar of the current measuring device illustrated in FIG. 3.
Figure 4B:
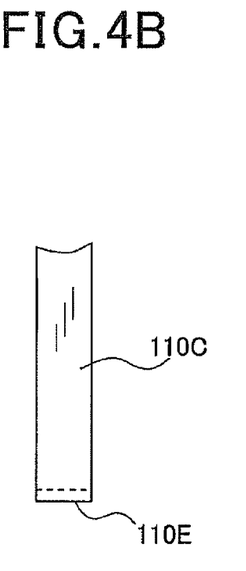
FIG. 4B is an enlarged side view of the busbar illustrated in FIG. 4A.

As illustrated in FIGS. 1, 4A and 4B, the major part of the busbar 110 is comprised of a first measurement resistor portion 110C embedded in the other wall 130B and extending in the longitudinal direction of the case 130; an upper end of the first measurement resistor portion 110C is bent in a horizontal direction perpendicular to the longitudinal direction of the case 130. The upper end of the first measurement resistor portion 110C extends in the top side wall 130A of the case 130 in the horizontal direction away from the other wall 130B so as to be joined to the first securement portion 112.

The major part of the busbar 110 is also comprised of a second measurement resistor portion 110D embedded in the other wall 130B and extending in the longitudinal direction of the case 130 with being opposite to the first measurement resistor portion 110C. Specifically, as illustrated in FIG. 4B, an inner major side of the first measurement resistor portion 110C is opposite to that of the second measurement resistor portion 110D. An upper end of the second measurement portion 110D is exposed so that one end of the second securement portion 114 located on the projecting part of the other wall 130B is joined to the exposed upper end of the second measurement portion 110D.

The major part of the busbar 110 is further comprised of a substantially U-shaped turned portion 110E embedded in the other wall 130B and continuously joining a lower end of the first measurement resistor portion 110C and that of the second measurement resistor portion 110D so that the busbar 110 is so shaped as to be folded back at the turn portion 110E.

That is, the first and second securement portions 112 and 114, as illustrated in FIGS. 1 to 4, lie on both sides of the major part of the busbar 110 and extend opposingly in perpendicular to the longitudinal direction of the case 130.

The first securement portion 112 has a substantially C shape in its lateral cross section. In other words, the first securement portion 112 is, as clearly illustrated in FIG. 3, made up of a bottom (major side wall) and two upright side walls extending from ends of the bottom perpendicular to the bottom. The bottom has a circular through hole 112A formed therein.

Referring back to FIG. 1, a metallic bracket 210 with a bolt 211 is provided for attaching the electric current measuring device 100 to the battery 200. Specifically, the metallic bracket serving as a terminal clamp is fit on the negative terminal 202 of the battery 200 for connecting the first securement portion 112 of the busbar 110 to the battery 200 electrically, thereby securing the current measuring device 100 to the battery 200. The metallic bracket 210 functions as an electric lead establishing electric connection between the current measuring device 100 and the battery 200.

Specifically, the metallic bracket 210 has on an end thereof the bolt 211 extending vertically from the metallic bracket 210. The installation of the first securement portion 112 to the metallic bracket 210 is achieved by fitting the through hole 112A of the first securement portion 112 over the head portion of the bolt 211 of the metallic bracket 210 through an open end of the first securement portion 112, and threadedly fastening a nut 221 onto the threaded portion of the bolt 211 to retain the first securement portion 112 to the metallic bracket 210 firmly. The bottom of the first securement portion 112 serves as a first joint surface 112B, as illustrated in FIG. 2, to which the metallic bracket 210 is joined firmly.

The second securement portion 114 of the busbar 110 has a circular through hole formed therein. A bolt 115 is embedded at its head portion in the projecting part of the other wall 130B to project at its threaded portion from the projecting part thereof so that the threaded portion of the bolt 115 is inserted through the circular hole. The harness 300 has formed at its one end a terminal 302 having formed therein a through hole. The joint of the terminal 302 to the second securement portion 114 is achieved by fitting the through hole of the one end of the terminal 302 over the threaded portion of the bolt 115 installed in the projecting part of the case 130, and threadedly fastening a nut 222 onto the threaded portion of the bolt 115 to secure the terminal 302 of the harness 300 to the second securement portion 114. An upper surface of the second securement portion 114 serves as a second joint surface 114B, as illustrated in FIG. 2, to which the terminal 302 is joined firmly.

The case 130 according to this embodiment is made of a resin, such as a PPS (polyphenylene sulfide) resin, which has greater electric insulation and thermal conductivity in comparison to those of air.

The busbar 110 is formed by, for example, molding the resin into a cavity of a die, which corresponds to the case 130, with preformed inserts corresponding to the major part of the busbar 110, the head portion of the bolt 115, and the like being provided in the cavity. The insert (busbar 110) is formed by, for example, pressing a conductive material, such as a metal material, into a bar shape, and thereafter, bending the bar-shaped conductive material in the form of the busbar 110.

The electric circuit measuring device 100 includes a pair of potential-difference sensing terminals 110A and 110B installed in the case 130 and linearly extending, to the circuit board 120, from corresponding measurement points on the respective first and second measurement resistor portions 110C and 110D. For example, the height of the measurement point on the first potential-difference sensing terminal 110C from a reference plane abutting the bottom end of the U-shaped turn portion 110E is greater than that of the measurement point on the second potential-difference sensing terminal 110D from the reference plane.

The portion of the busbar 110 defined from the measurement point on the first measurement resistor portion 110C to the measurement point on the second measurement resistor portion 110D is defined as a shunt resistor 100' with a predetermined resistance.

For example, the pair of potential-difference sensing terminals 110A and 110B is formed in a linear bar shape integrally with the busbar 110 from the same conductive material in the pressing process. After the pressing process, during the bending process of the busbar 110, the potential-difference sensing terminal 110A is bent in a direction perpendicular to the length direction of the first measurement resistor portion 110C away from the second measurement resistor portion 110D, and the potential-difference sensing terminal 110B is bent in a direction perpendicular to the length direction of the second measurement resistor portion 110D to the first measurement resistor portion 110C. The bending process of the potential-difference sensing terminals 110A and 110B can be carried out after the bending process of the busbar 110.

Extending ends of the potential-difference sensing terminals 110A and 110B are electrically connected to the current measuring circuit of the circuit board 120.

The connector 140 is integrally formed with the case 130 so as to extend downwardly from a bottom side wall 130C. For example, the connector terminals 142 is formed by the insert molding set forth above together with the busbar 140.

Figure 5:
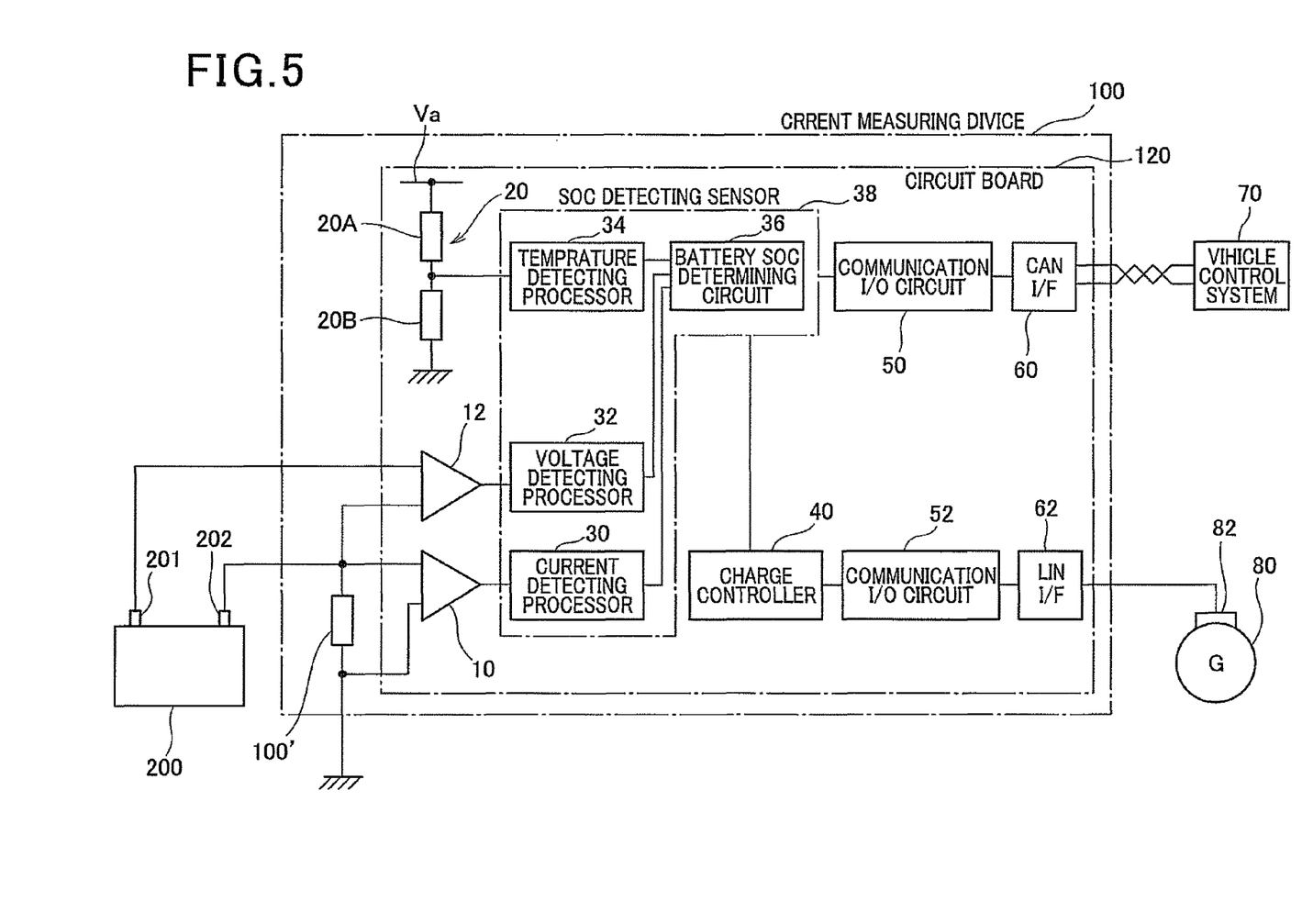
FIG. 5 is a circuit diagram schematically illustrating a circuit structure of the current measuring device illustrated in FIG. 1.

FIG. 5 schematically illustrates an example of the circuit structure of the current measuring device 100 placed in connection to the battery 200. The current measuring device 100 has the circuit board 120 on/in which a differential amplifier 10, a differential amplifier 12, a temperature detector 20, a current detecting processor 30, a voltage detecting processor 32, a temperature detecting processor 34, a battery SOC (State-Of-Charge) determining circuit 36, a charge controller 40, communication I/O circuits 50 and 52, a CAN interface 60, and a LIN interface 62 are fabricated.

The differential amplifier 10 is connected to ends of the shunt resistor 100', that is, the existing ends of the potential-difference sensing terminals 110A and 110B of the busbar 110. The differential amplifier 12 is connected to the positive terminal 201 and the negative terminal 202 of the battery 200. The CAN interface 60 is operative to transmit and receive data in the form of a CAN protocol. The LIN interface 62 is operative to transmit and receive data in the form of a LAN protocol.

The differential amplifier 10 is operative to amplify a voltage across the ends (the measurement points) of the shunt resistor 100'. The current detecting processor 30 is operative to determine an electric current flowing through the shunt resistor 100' (the portion of the busbar 110 between the measurement points via the U-shaped turn portion 110E) based on the voltage outputted from the differential amplifier 10. Specifically, the current detecting processor 30 is operative to calculate a level of the electric current using Ohm's law, the voltage outputted from the differential amplifier 10, and the predetermined resistance of the shunt resistor 100'. The current detecting processor 30 is also operative to output, to the battery SOC determining circuit 36, a signal in analog or digital format indicative of the level of the electric current. The differential amplifier 10 and the current detecting processor 30 serve as the current measuring circuit.

The differential amplifier 12 is operative to convert the voltage, in other words, battery voltage, across the positive and negative terminals 201 and 202 of the battery 200 into a selected voltage level. The voltage detecting processor 32 is operative to determine the battery voltage based on the voltage outputted from the differential amplifier 12, and output a signal in analog or digital format indicative of the battery voltage.

The temperature detector 20 is comprised of, for example, a voltage divider consisting of at least one resistor 20A with a fixed resistance and a thermistor 20B connected in series between an applied voltage Va (voltage source) so that the voltage at the point between the at least one resistor 20A and the thermistor 20B is defined as a fraction of the applied voltage Va;

this fraction is determined by the fixed resistance of the resistor 20A and the resistance of the thermistor 20B; this resistance of the thermistor 20B changes with change in the temperature around the thermistor 20B. That is, the temperature detector 20 is operative to detect the fraction of the applied voltage Va across the series circuit as a parameter indicative of the temperature around the thermistor 20B.

In this embodiment, the at least one resistor 20A is electrically connected to the voltage-source side, and the thermistor 20B is electrically connected to the ground side, but the present invention is not limited to the structure. Specifically, the thermistor 20B can be electrically connected to the voltage-source side, and the at least one resistor 20A can be electrically connected to the ground side.

The temperature detecting processor 34 is operative to monitor the fraction of the applied voltage Va outputted from the temperature detector 20 to determine the temperature of the current measuring device 100, that is, the temperature of the battery 200. The temperature detecting processor 34 is operative to output a signal in analog or digital format indicative of the temperature of the battery 200.

The battery SOC deter mining circuit 36 is operative to receives the signals outputted from the current detecting circuit 30, the voltage detecting processor 32, and the temperature detecting processor 34 to thereby produce a battery state-of-charge signal. The current detecting processor 30, the voltage detecting processor 32, the temperature detecting processor 34, and the battery SOC determining circuit 36 serve as an SOC detecting sensor.

The charge controller 40 is operative to sample the battery state-of-charge signal outputted from the battery SOC determining circuit 36 to thereby control electric generation, that is, an output power, of an in-vehicle electric generator 80 installed in, for example, the engine room of the motor vehicle.

Specifically, the charge controller 40 is operative to output, through the communication I/O circuit 52 and the LIN interface 62, control signals in the form of the LIN protocol to a generator controller 82 installed in, for example, the generator 80 to thereby control the output power of the generator 80.

The battery state-of-charge signal, as outputted from the battery SOC determining circuit 36, is transmitted, through the communication I/O interface 50 and the CAN interface 60, to a vehicle control system 70 installed in, for example, the engine room of the motor vehicle. The vehicle control system 70 is operative to perform given integrated control tasks to control operations of the engine and various in-vehicle electric loads installed in the motor vehicle based on the state-of-charge of the battery 200 grasped by the battery state-of-charge signal.

The current measuring device 100 according to this embodiment is configured such that the busbar 110 is comprised of: the first and second measurement resistor portions 110C and 110D extending from the respective first and second securement portions 112 and 114; and the U-shaped turn portion 110E continuously joining the extending ends of the first and second measurement resistor portions 110C and 110D.

In other words, the configuration of the busbar 110 is configured to determine the voltage drop between the first and second measurement points on the busbar 110 independently of the length of the interval between the first and second securement portions 112 and 114.

This configuration of the busbar 110 allows the interval between the first and second securement portions 112 and 114 to be reduced as much as possible while keeping the conductive path through the busbar 110 long in length. The configuration of the busbar 110 therefore improves the installability and vibration-resistance of the current measuring device 100 while maintaining at a high level the current-measuring accuracy thereof.

This configuration of the busbar 100 also allows the case 130 to be closely opposite to the one side surface 200B of the battery 200. This results in a reduction in the length extending from the negative terminal 202 of the battery 200.

The current measuring device 100 according to this embodiment is also configured such that the major part of the busbar 110 is embedded in the resin-molded case 130. This configuration effectively transfers heat, which is generated when the busbar 110 is energized, from the busbar 110 to the case 130 because resin is higher in heat-conductivity than air to thereby reduce the rise of the busbar 110 in temperature when the busbar 110 is energized, resulting in an improvement in the current-measuring accuracy of the current measuring device 100.

The current measuring device 100 according to this embodiment is also configured such that the major part of the busbar 110 is formed by the insert molding integrally with the case 130. This feature effectively transfers heat, which is generated when the busbar 110 is energized, from the busbar 110 to the case 130 because resin is higher in heat-conductivity than air to thereby reduce the rising of the busbar 110 in temperature when the busbar 110 is energized, resulting in an improvement in the current-measuring accuracy of the current measuring device 100.

The case 130 of the current measuring device 100 according to this embodiment is made of a resin, such as a PPS resin, which has greater electric insulation and thermal conductivity, which ensures stable heat-transfer from the busbar 110 to the resin-molded case 130, thus reducing the rising of the busbar 110 in temperature. The resin-molded case 130 set forth above also improves its durability performance against temperature and/or liquid subjected thereto when it is installed in the engine room.

The current measuring device 100 according to this embodiment is further configured such that the major part of the busbar 110 comprised of the first and second measurement resistor portions 110C and 110D, and the U-shaped turn portion 110E is embedded in the resin-molded case 130. This configuration more effectively transfers heat, which is generated when the busbar 110 is energized, from the shunt resistor 100' to the case 130, resulting in a more stable improvement in the current-measuring accuracy of the current measuring device 100.

While the present invention has been described in view of the preferred embodiment for facilitating better understanding thereof, the embodiment can be modified within the scope of the present invention.

The current measuring device 100 according to this embodiment is connected to the negative terminal 202 of the battery 200, but can be connected to the positive terminal 201 thereof.

The major part of the busbar 110 except for the exposed first and second securement portions 112 and 114 according to this embodiment is so formed by insert molding as to be embedded in the case 130, but a part of the major part of the busbar 110 can be exposed to the inside or outside of the case 130, resulting in a reduction in the region of the major part of the busbar 110; this region is embedded in the case 130.

The chamber of the case 130 in which the circuit board 120 is placed according to this embodiment is closed by the cover 150, but can be alternatively filled with, for example, epoxy resin to encapsulate the circuit board 120.

The portion of the busbar 110 defined from the measurement point on the first measurement resistor portion 110C to the measurement point on the second measurement resistor portion 110D is defined as the shunt resistor 100' according to this embodiment, but the present invention is not limited thereto.

Specifically, an alternative resistor separated from the busbar 110 and connected between the measurement point on the first measurement resistor portion 110C and the measurement point on the second measurement resistor portion 110D, can be used as the shunt resistor 100'.

The first securement portion 112 according to this embodiment has the substantially C shape in its lateral cross section, but can have a substantially V-shape in its lateral cross section. The first securement portion 112 can have a flat shape in its lateral cross section, when the current measuring device 100 is used for vehicles with less vibration.

The first measurement resistor portion 110C and the second measurement resistor portion 110D according to this embodiment are arranged to be opposite to each other (see FIG. 4A), but they can have an offset (displacement) in a direction perpendicular to their inner major sides and their longitudinal directions.

Figure 6A:
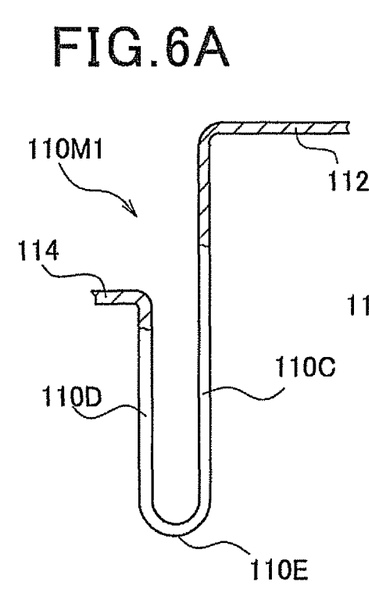
FIG. 6A is a front view of a modification of the busbar according to the embodiment.
Figure 6B:
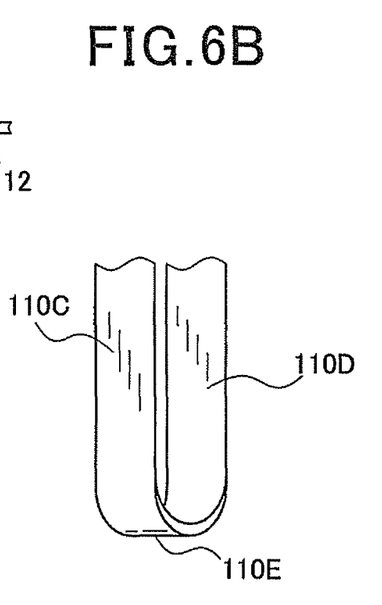
FIG. 6B is an enlarged side view of the modification of the busbar illustrated in FIG. 6A.

FIG. 6A is a front view of such a modification 110M1 of the busbar 110, and FIG. 6B is an enlarged side view of the modification 110M1 of the busbar 110 illustrated in FIG. 6A.

The modification 110M1 of the busbar 110 has substantially the same configuration as that of the busbar 110 except for that the first and second measurement resistor portions 110C and 110D have an offset (displacement) in a direction perpendicular to their inner major sides and their longitudinal directions. Because the configuration of the modification M1 of the busbar 110 allows the interval between the first and second securement portions 112 and 114 to be reduced as much as possible while keeping the conductive path through the busbar 110 long in length. The configuration of the modification M1 of the busbar 110 improves the installability and vibration-resistance of the current measuring device 100.

Each of the first and second measurement resistor portions 110C and 110D according to this embodiment linearly extends in its current-flowing direction, but at least part of each of the first and second measurement resistor portions 110C and 110D can extend in a wavelike fashion in its current flowing direction.

Figure 7:
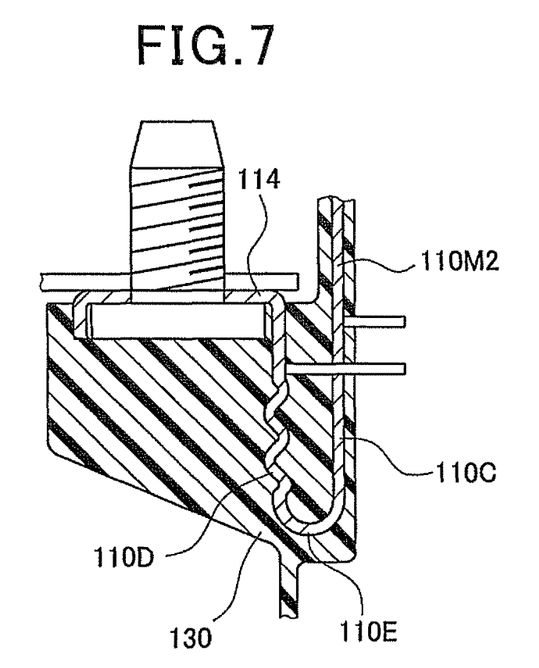
FIG. 7 is an enlarged cross-sectional view of a wavy portion of an alternative modification of the busbar according to the embodiment.

FIG. 7 is an enlarged cross-sectional view of a wavy portion of such a modification 110M2 of the busbar 110. Part of the second measurement resistor portion 110D of the modification 110M2 of the busbar 110 extends in a wavelike fashion in its current flowing direction. The wavy portion of at least one of the first and second measurement resistor portions 110C and 110D increases the contact area between the modification 110M2 of the busbar 110 and the resin-molded case 130 in comparison to the busbar 110. This results in: more effective transfer in heat, which is generated when the modified busbar 110M2 is energized, from the modified busbar 110M2 to the resin-molded case 130, more improvement in the current measuring accuracy of the current measuring device 100, and more increase in the rigidity of the modified busbar 110M2 to thereby improve the vibration-resistance thereof.

As illustrated in FIG. 7, part of the second measurement resistor portion 110D can be only formed in a wavelike fashion. The second securement portion 114 to which the harness 300 for electrical connection of the plurality of in-vehicle components is secured may be more subjected to vibrations as compared with the first securement portion 112 secured to the negative terminal 202 of the battery 200 via the metallic bracket 210. For this reason, the wavy portion of the second measurement resistor portion 110D improves the rigidity thereof to effectively improve the vibration-resistance of the second measurement resistor portion 110D. Part of each of the first and second measurement resistor portions 110C and 110D can be formed in a wavelike fashion; this configuration enhances the effects set forth above. Part of the first measurement resistor portion 110C can be only formed in a wavelike fashion.

Figure 8:
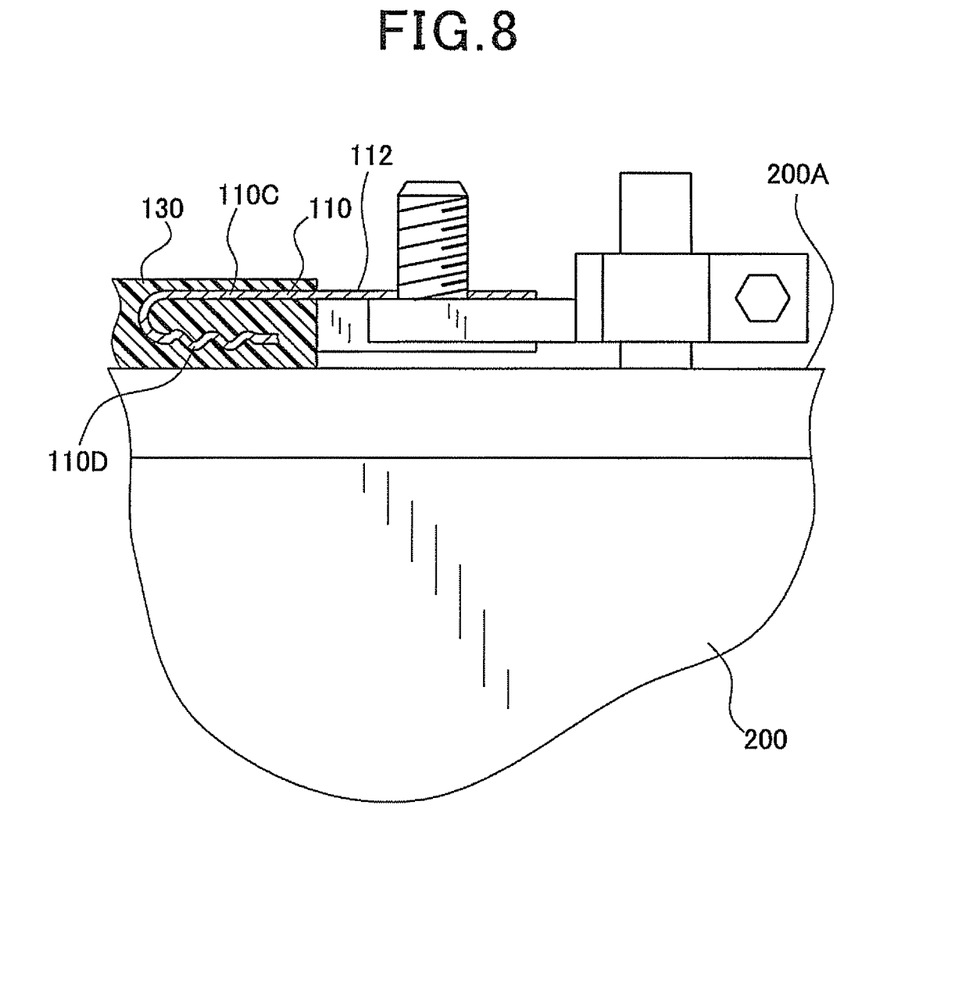
FIG. 8 is an enlarged partially sectional view of an electric current measuring device according to a further modification of the embodiment.

The current measuring device 100 according to this embodiment is designed such that the case 130 of the busbar 110 is arranged to be closely opposite to the one side surface 200B of the battery 200, but the present invention is not limited thereto. The case can be mounted on one side surface 200B of the battery 200. In addition, a modification 100M of the current measuring device 100 is designed such that the case 130, as illustrated in FIG. 8, is closely opposite to or mounted on the upper surface 200A of the battery 200. This configuration allows each of the first and second measurement resistor portions 110C and 110D extends in a direction parallel to the upper surface 200A of the battery 200. In FIG. 8, part of the second measurement resistor portion 110D is formed in a wavelike shape.

The modification 100M of the current measuring device 100 locates the busbar 110 in an overhead space of the battery 200 wider than a limited side space thereof, resulting in more improvement of the installability of the modification 100M of the current measuring device 100. In addition, the busbar 110 is comprised of: a pair of the first and second measurement resistor portions 110C and 110D extending from the respective first and second securement portions 112 and 114 in the direction parallel to the upper surface 200A of the battery 200; and the U-shaped turn portion 110E continuously joining the extending ends of the first and second measurement resistor portions 110C and 110D. For this reason, the modification 100M of the current measuring device 100 reduces the amount of the busbar 110 projecting from the overhead space of the battery 200 as compared with a current sensor using a flat and long busbar, resulting in more improvement in the installability of the modified current measuring device 100M.

While there has been described what is at present considered to be this embodiment and its modifications of the present invention, it will be understood that various modifications which are not described yet may be made therein, and it is intended to cover in the appended claims all such modifications as fall within the scope of the invention.

What is claimed is:

1. A current measuring device for measuring an electric current flowing through between a terminal of a battery and a wire, the battery having a side surface and an upper surface continuous with the side surface, the current measuring device comprising: a resistance member having a length and first and second ends in a direction of the length, the first end to be secured electrically to the terminal of the battery, the second end to be secured electrically to the wire, the resistance member constituting a current flow path between the terminal of the battery and the wire; and a circuit board in which a current measuring circuit is installed, the current measuring circuit being configured to measure an electric current flowing through the resistance member based on a potential difference between two different first and second points defined on the resistance member, wherein the resistance member comprises: a resistor, the resistor comprising: a first resistance portion extending along one of the side surface and the upper surface of the battery; a second resistance portion extending along the one of the side surface and the upper surface of the battery; a turned through which the current flow path extends, the turned portion continuously physically joining the first and second resistance portions, the first and second points being defined on the respective first and second resistance portions; and a pair of potential-difference sensing terminals connected to the respective first and second points.

2. The current measuring device according to claim 1, wherein:
the resistance member comprises:
a first securement member with the first end to be secured electrically to the terminal of the battery; and
a second securement member with the second end to be secured electrically to the wire, the resistor being disposed between the first and second securement members; and
the resistor further comprises:
a resin-molded case located between the first and second securement members, the circuit board being installed in the resin-molded case, at least part of the resistor being embedded in the resin-molded case.

3. The current measuring device according to claim 2, wherein at least part of the resistor is formed in a wavelike fashion in a direction of the current flow path therethrough.

4. The current measuring device according to claim 2, wherein the resistor has a U-shaped turn portion as the turned portion so that the current measuring circuit is configured to measure the electric current flowing through the resistance member based on the potential difference between the two different points defined on the resistance member, the two different points being spaced apart from each other via the U-shaped turn portion, the at least part of the resistor embedded in the resin-molded case containing at least the U-shaped turn portion and the two different points.

5. The current measuring device according to claim 2, wherein the turned portion has a substantially U-shape in a direction of the current flow path therethrough.

6. The current measuring device according to claim 5, wherein at least part of the second resistance portion is formed in a wavelike fashion in a direction of the current flow path therethrough.

7. The current measuring device according to claim 5, wherein each of the first and second resistance portions is so located directly, on the one of the side surface and the upper surface of the battery.

8. The current measuring device according to claim 5, wherein each of the first and second resistance portions is so located to be opposite to the one of the side surface and the upper surface of the battery.

9. The current measuring device according to claim 2, wherein the resin-molded case is made of a resin having a predetermined level of electrical insulation and a predetermined level of thermal conductivity, the predetermined level of electric insulation being greater than an electric insulation of air, the predetermined level of thermal conductivity being greater than a thermal conductivity of air.

10. The current measuring device according to claim 9, wherein the resin is a PPS (polyphenylene sulfide) resin.

* * * * *